US008849174B2

(12) United States Patent
Jeong

(10) Patent No.: US 8,849,174 B2
(45) Date of Patent: Sep. 30, 2014

(54) IMAGE FORMING APPARATUS

(75) Inventor: Yoo Hung Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 190 days.

(21) Appl. No.: 13/338,613

(22) Filed: Dec. 28, 2011

(65) Prior Publication Data

US 2012/0170956 A1 Jul. 5, 2012

(30) Foreign Application Priority Data

Jan. 4, 2011 (KR) ........................ 10-2011-0000665

(51) Int. Cl.

| | |
|---|---|
| ***G03G 21/12*** | (2006.01) |
| ***G03G 21/10*** | (2006.01) |
| *G03G 15/20* | (2006.01) |

(52) U.S. Cl.

CPC .............. *G03G 21/105* (2013.01); *G03G 21/12* (2013.01); *G03G 15/2017* (2013.01); *G03F 15/657* (2013.01)

USPC ............ 399/360; 399/320; 399/400; 271/266

(58) Field of Classification Search

CPC ............ G03G 15/2017; G03G 15/657; G03G 21/007; G03G 21/105; G03G 21/12

USPC ........................... 399/358, 360, 400; 271/266

See application file for complete search history.

(56) References Cited

U.S. PATENT DOCUMENTS

| | | | | |
|---|---|---|---|---|
| 5,121,168 | A * | 6/1992 | Aoki et al. | 399/359 |
| 2005/0220515 | A1* | 10/2005 | Wakana | 399/358 |
| 2005/0230900 | A1* | 10/2005 | Yamada et al. | 271/10.11 |
| 2007/0009284 | A1* | 1/2007 | Okamoto et al. | 399/101 |

FOREIGN PATENT DOCUMENTS

| | | | | |
|---|---|---|---|---|
| JP | 07168491 | A * | 7/1995 | G03G 21/10 |
| KR | 1020060043651 | | 5/2006 | |

* cited by examiner

*Primary Examiner* — Benjamin Schmitt

(74) *Attorney, Agent, or Firm* — Stanzione & Kim, LLP

(57) ABSTRACT

An image forming apparatus includes a developing unit configured to develop an electrostatic latent image to a visible image by use of toner, a fuser unit configured to fuse toner on a printing medium, a fuser driving unit configured to drive the fuser unit, and a waste toner storage unit configured to receive and store waste toner, which is generated from the developing unit, wherein the waste toner storage unit operates by receiving power from the fuser driving unit such that a separate driving unit for the waste toner storage unit is not required.

20 Claims, 6 Drawing Sheets

IMAGE FORMING APPARATUS

CROSS-REFERENCE TO RELATED APPLICATIONS

This application claims the priority under 35 U.S.C. §119 from Korean Patent Application No. 10-2011-0000665, filed on Jan. 4, 2011 in the Korean Intellectual Property Office, the disclosure of which is incorporated herein by reference in its entirety.

BACKGROUND OF THE INVENTION

1. Field of the Invention

Embodiments of the present disclosure relate to an image forming apparatus including a fuser unit and a fuser driving unit to drive the fuser unit.

2. Description of the Related Art

In general, an image forming apparatus represents an apparatus configured to form an image on a printing medium. The image forming apparatus may include a printer, a copy machine, a facsimile, and a multi-functional equipment incorporating the functionality of the printer, the copy machine, and the facsimile.

According to operations of the image forming apparatus, a photoconductor having a charged surface is scanned by the light of an exposure device such that an electrostatic latent image is formed on the surface of the photoconductor, and toner is then provided to electrostatic latent image through a developing unit such that the electrostatic latent image is developed to a visible toner image. The visible image developed on the photo conductor through use of the toner is transferred to a printing medium, and the toner transferred onto the printing medium is fused through a fuser unit.

In developing the electrostatic latent image to the visible image in the image forming apparatus, waste toner is generated in the developing unit. Accordingly, the image forming apparatus includes a waste toner storage unit configured to receive and store the waste toner.

SUMMARY OF THE INVENTION

Embodiments of the present disclosure provide an image forming apparatus capable of using a power, which is generated in a fuser driving unit, to drive other components.

Additional features of the disclosure will be set forth in part in the description which follows and, in part, will be apparent from the description, or may be learned by practice of the disclosure.

Exemplary embodiments of the present disclosure provide an imaging forming apparatus including a developing unit, a fuser unit, a fuser driving unit and a waste toner storage unit. The developing unit includes a photoconductor corresponding to an image receptor and configured to develop an electrostatic latent image on the photoconductor to a visible image by use of toner. The fuser unit is configured to fuse the toner transferred on a printing medium. The fuser driving unit is configured to drive the fuser unit. The waste toner storage unit is configured to receive waste toner separated from the photoconductor and to store the waste toner. The waste toner storage unit operates by receiving power from the fuser driving unit.

The waste toner storage unit includes a waste toner storage part configured to store the waste toner and a waste toner delivery part configured to deliver the waste toner from the developing unit to the waste toner storage part.

The waste toner delivery part may include an inlet, to which the waste toner is delivered from the developing unit, an outlet delivering the waste toner to the waste toner storage part, and a delivery auger to deliver the waste toner from the inlet to the outlet.

The waste toner storage part may include a waste toner storage case to accommodate the waste toner and a flattening auger rotatably installed inside the waste toner storage case, wherein the flattening auger operates by receiving power from the waste toner delivery part.

The image forming apparatus further includes a shaft to convey the power from the fuser driving unit to the waste toner delivery part.

The image forming apparatus further includes an irregular paper delivery unit disposed on a paper delivery path between the developing unit and the fuser unit, wherein the irregular paper delivery unit is disposed on the shaft.

The irregular paper delivery unit includes a driving pulley disposed on the shaft, a driven pulley disposed while being spaced apart from the driving pulley, and a belt wound around the driving pulley and the driven pulley.

The image forming apparatus further includes a main driving unit formed independent of the fuser driving unit to drive the developing unit.

Exemplary embodiments of the present disclosure also provide an image forming apparatus including a developing unit, a main driving unit, a fuser unit, a fuser driving unit and an irregular paper delivery unit. The developing unit includes a photoconductor corresponding to an image receptor and configured to develop an electrostatic latent image on the photoconductor to a visible image by use of toner. The main driving unit is configured to drive the developing unit. The fuser unit is configured to fuse toner transferred on a printing medium. The fuser driving unit is formed independent of the main driving unit to drive the fuser unit. The irregular paper delivery unit is disposed on a paper delivery path between the developing unit and the fuser unit. The irregular paper delivery unit includes a shaft connected to the fuser driving unit, a driving pulley disposed on the shaft, a driven pulley disposed while being spaced apart from the driving pulley, and a belt wound around the driving pulley and the driven pulley.

Exemplary embodiments of the present disclosure may also provide an image forming apparatus including a developing unit, a fuser unit, a fuser driving unit, a waste toner, a storage part, a waste toner delivery part, a shaft and an irregular paper delivery unit. The developing unit includes a photoconductor corresponding to an image receptor and configured to develop an electrostatic latent image on the photoconductor to a visible image by use of toner. The fuser unit is configured to fuse toner transferred to a printing medium. The fuser driving unit is configured to drive the fuser unit. The waste toner storage part is configured to store waste toner separated from the photoconductor. The waste toner delivery part is configured to deliver the waste toner from the developing unit to the waste toner storage part. The shaft has a first end connected to the fuser driving unit and a second end connected to the waste toner delivery part. The irregular paper delivery unit is disposed on the shaft. The waste toner storage part operates by receiving power from the waste toner delivery part.

Exemplary embodiments of the present disclosure may also provide an image forming apparatus including a developing unit, a main driving unit, a fuser unit, a fuser driving unit, a waste toner storage part and an irregular paper delivery unit. The developing unit includes a photoconductor corresponding to an image receptor and configured to develop an electrostatic latent image on the photoconductor to a visible image by use of toner. The main driving unit is configured to drive the developing unit. The fuser unit is configured to fuse toner transferred on a printing medium. The fuser driving unit is formed independent of the main driving unit to drive the fuser unit. The waste toner storage part is configured to store waste toner separated from the photoconductor. The waste toner delivery part is configured to deliver the waste toner from the developing unit to the waste toner storage part. The irregular paper delivery unit is disposed on a paper delivery path between the developing unit and the fuser unit. At least one of the waste toner storage part, the waste toner delivery part, and the irregular paper delivery unit operates by receiving power from the fuser driving unit.

Exemplary embodiments of the present disclosure also provide an image forming apparatus, comprising: a developing unit to develop a toner image on a photoconductive member; a fixing unit to fix the developed toner image onto a recording medium, the fixing unit including fixing rollers and a fixing unit driving member; and a waste toner storage unit to store waste toner removed from the developing unit after developing a toner image, and to process the stored waste toner by receiving power from the fixing unit driving member.

In an exemplary embodiment, the image forming apparatus further comprises a shaft extending between the driving member of the fixing unit and the waste toner storage unit to receive and transfer power from the driving member of the fixing unit to drive the waste toner storage unit to process the stored waste toner.

In an exemplary embodiment, the image forming apparatus further comprises an irregular paper delivery unit disposed on the shaft along a paper delivery path and between the developing unit and the fixing unit such that the irregular paper delivery unit conveys irregular paper along the delivery path by power transferred from the driving member.

In an exemplary embodiment, the image forming apparatus further comprises a main driving unit to drive the developing unit.

BRIEF DESCRIPTION OF THE DRAWINGS

These and/or other features and utilities of the disclosure will become apparent and more readily appreciated from the following description of the embodiments, taken in conjunction with the accompanying drawings of which.

DETAILED DESCRIPTION

Figure 1:
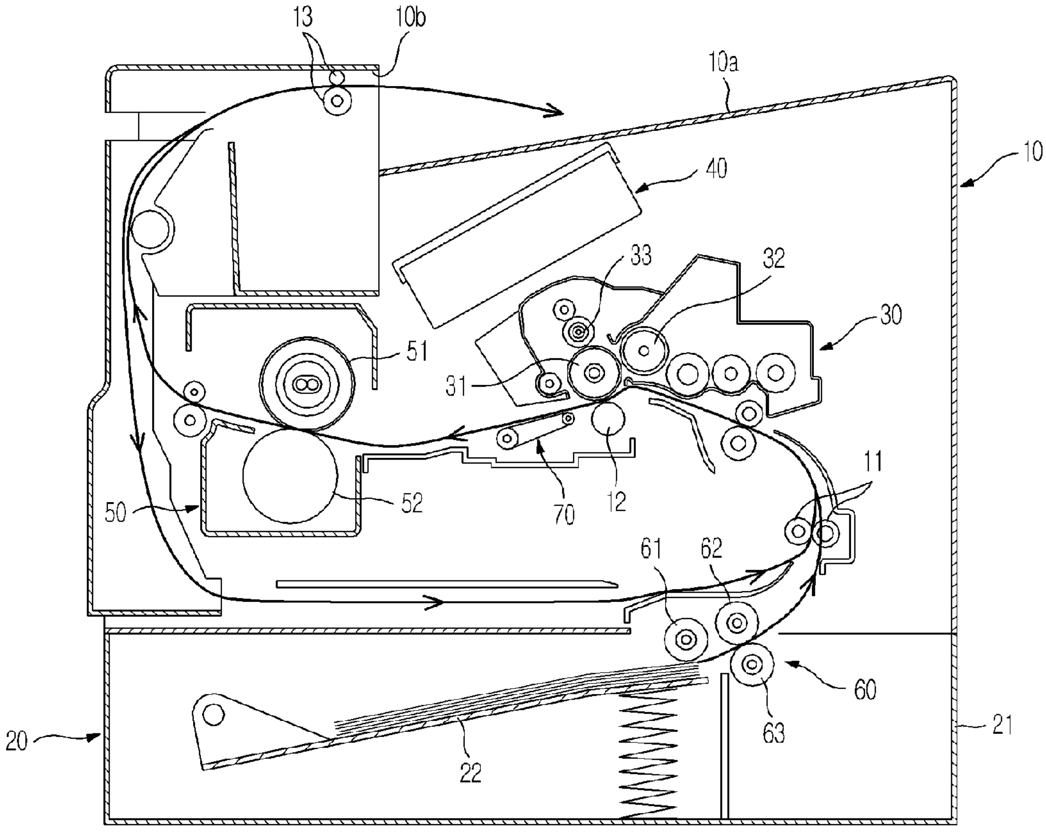
FIG. 1 is a schematic view illustrating an example of an image forming apparatus.

Reference will now be made in detail to the embodiments of the present disclosure, examples of which are illustrated in the accompanying drawings, wherein like reference numerals refer to like elements throughout.

Referring to FIG. 1, an image forming apparatus includes a body 10 forming an external appearance of the image forming apparatus, a printing medium storage unit 20 to store printing mediums, a developing unit 30 to provide an electrostatic latent image with toner to develop the electrostatic latent image to a visible image, an exposure unit 40 to form an electrostatic latent image on a charged photoconductor 31 of the developing unit 30, and a fuser unit 50 to fuse the toner developed on a printing medium.

The body 10 is provided at an upper side thereof with a loading part 10*a* configured to load printing mediums, which have been completed with imaging. A paper discharge outlet 10*b* is provided at one side of the loading part 10*a* to discharge printing mediums having been completed with imaging.

The printing medium storage unit 20 includes a printing medium cassette 21, which is provided on the body 10 to move back and forth, and a knock-up plate 22 disposed on the printing medium cassette 21 to have printing media loaded thereon.

The developing unit 30 includes a photoconductor 31 which is formed using an image receptor to receive a visible image generated from toner, and is configured to have a surface on which an electrostatic latent image is formed through an exposure unit 40, a developing roller 32, which provides the photoconductor 31 with the toner to develop the electrostatic latent image on the photoconductor 31 to a visible image, and a charger roller 33 to charge the surface of the photoconductor 31. Although not shown in the drawings, a main driving unit is disposed at one side of the developing unit 30 to drive the developing unit 30.

The exposure unit 40 forms an electrostatic latent image on the surface of the photoconductor 31 by radiating the light including image information onto the photoconductor 31 of the developing unit 30.

Figure 2:
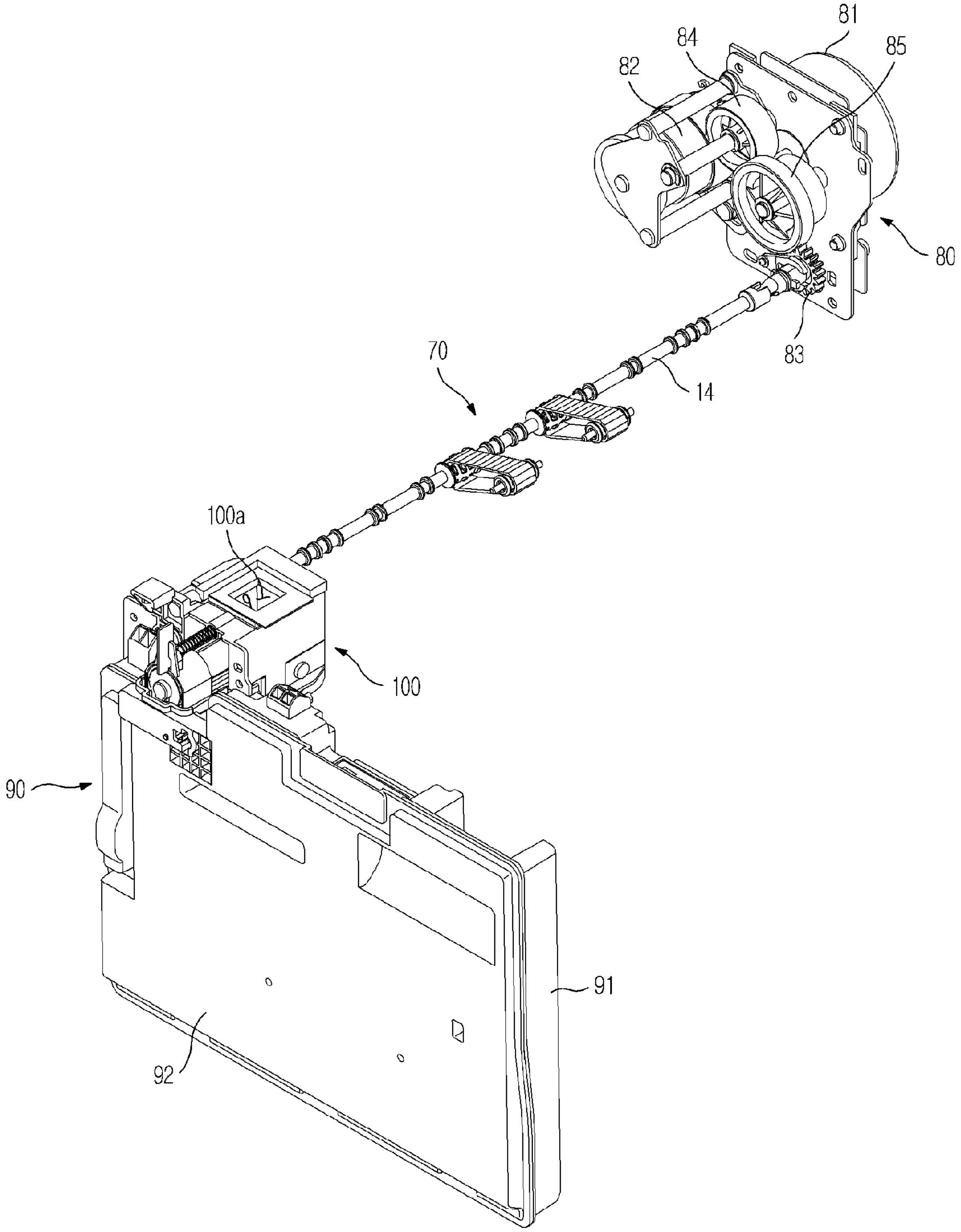
FIG. 2 is a perspective view illustrating an example of a fuser driving unit, an irregular paper delivery unit, a waste toner delivery part, and a waste toner storage part used in the image forming apparatus.

The fuser unit 50 includes a heating roller 51 to generate heat and a pressure roller 52, which has an outer surface formed using elastically deformable material, to press the printing medium against the outer surface of the heating roller 51. As illustrated in FIG. 2, a fuser driving unit 80 is disposed at one side of the fuser unit 50 to rotate the heating roller 51 and the pressure roller 52.

In order to prevent the heat generated from the fuser unit 50 from influencing the developing unit 30, the fuser unit 50 is disposed at a position which is spaced apart from the developing unit 30. In a case when the developing unit 30 and the fuser unit 50 are to be spaced apart from each other, an irregular paper having a small size (a postcard, for example), may fail to be directly delivered from the developing unit 30 to the fuser unit 50.

Figure 3:
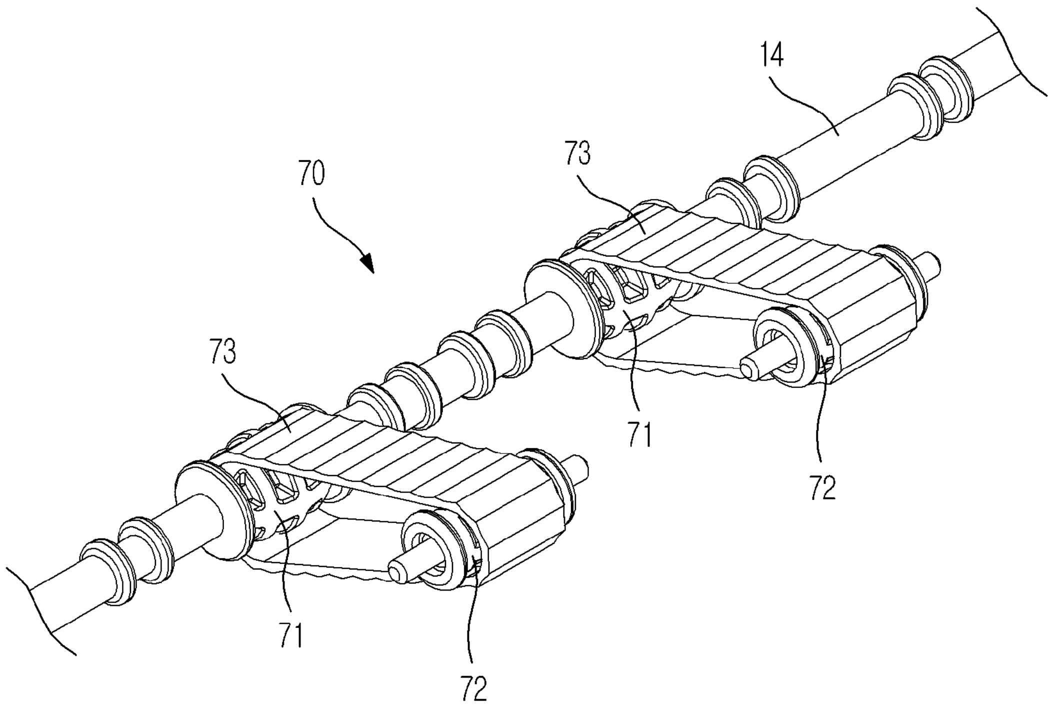
FIG. 3 is a perspective view illustrating an example of the irregular paper delivery unit used in the image forming apparatus.

Accordingly, an irregular paper delivery unit 70 is disposed on a paper delivery path between the developing unit 30 and the fuser unit 50 to deliver an irregular paper smaller than a regular paper. Referring to FIG. 3, the irregular paper deliver unit 70 includes a driving pulley 71 which rotates by receiving a rotary force, a driven pulley 72 which is disposed while being spaced apart from the driving pulley 71, and a belt 73 which is wound around the driving pulley 71 and the driven pulley 72. Protrusions are formed on the outer surface of the belt 73 such that a rear end of the irregular paper is caught on the protrusions and is easily moved. According to this example, the driving pulley 71 includes two driving pulleys disposed in parallel, the driven pulley 72 includes two driven pulleys disposed in parallel, and the belt 73 includes two belts disposed in parallel.

Referring again to FIG. 1, the body 10 further includes a pick-up unit 60, a pair of delivery rollers 11, a transfer roller 12, and a pair of discharge rollers 13. The pick-up unit 60 is disposed at an upper side of the printing medium storage unit 20 to pick up the printing mediums loaded on the knock-up plate 22 one by one. The one pair of delivery rollers 11 is disposed above the pick-up unit 60 to guide the picked up printing medium upward to the developing unit 30. The transfer roller 12 is disposed facing the photoconductor 31 such that the toner on the photoconductor 31 is transferred to a printing medium. The one pair of discharge rollers 13 is disposed to be adjacent to the paper discharge outlet 10*b* over the fuser unit 50 to allow a printing medium having passed through the fuser unit 50 to be discharged through the paper discharge outlet 10*b*.

The pick-up unit 60 includes a pick-up roller 61 configured to pick up the printing mediums one by one while making contact with the printing mediums on the knock-up plate 22, a forward roller 62 configured to receive and move the printing medium, which is picked up by the pick-up roller 61, toward the delivery roller 11, and a retard roller 63 which is disposed while facing the forward roller 62 to prevent a plurality of printing medium from moving at the same time.

The delivery roller 11 includes a pair of delivery rollers which are disposed while facing each other such that a printing medium passes between the pair of delivery rollers.

Referring to FIG. 2, the fuser driving unit 80 includes a fuser motor 81 which generates a rotary force, a fuser driving gear 82, which is rotated by receiving a rotary force from the fuser motor 81 through gears 84 and 85 to operate the fuser unit 50, and a shaft driving gear 83 which is rotated by receiving a rotary force from the gears 84 and 85 to rotate a shaft 14 that is to be described later.

In a process of developing a visible image on a printing medium with toner, waste toner is generated in the developing unit 30. Accordingly, a waste toner storage unit including a waste toner storage part 90 and a waste toner delivery part 100 is installed at one side of the body 10. The waste toner storage part 90 is detachably installed at one side of the body 10 and stores a waste toner. The waste toner delivery part 100 is configured to guide the waste toner separated from the photoconductor 31 to the waste toner storage unit 90.

Figure 4:
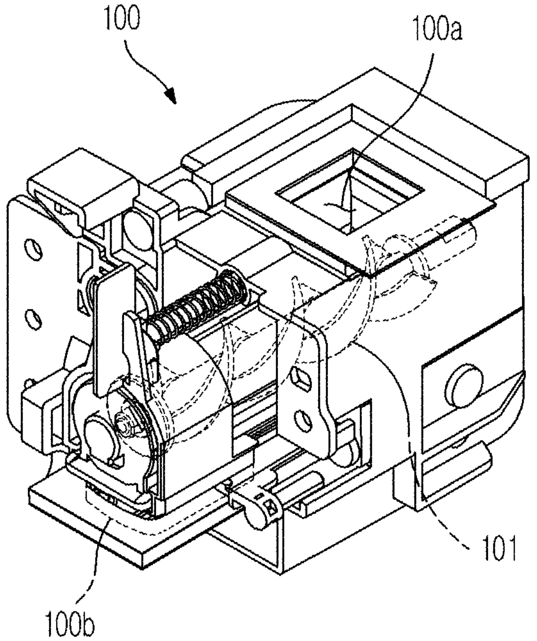
FIG. 4 is a perspective view illustrating an example of the waste toner delivery part used in the image forming apparatus.
Figure 5:
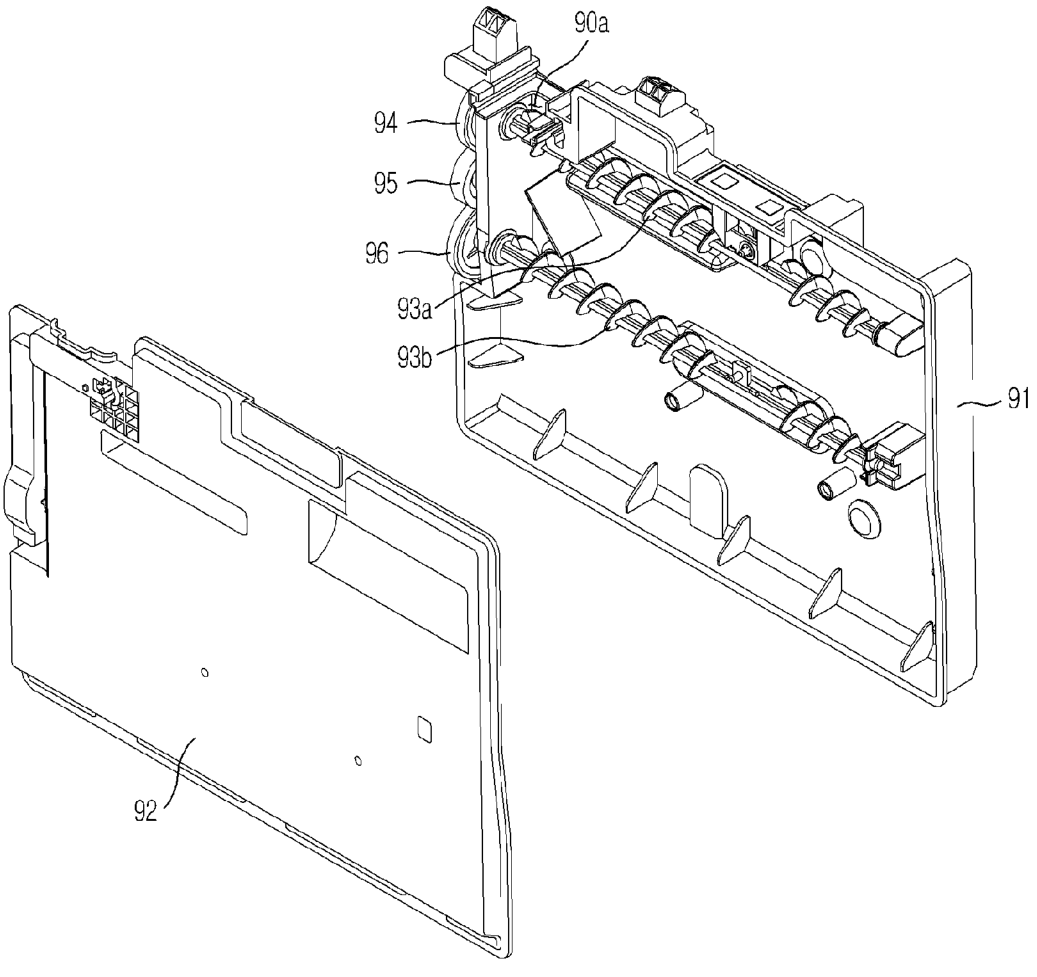
FIG. 5 is an exploded perspective view illustrating an example of the waste toner storage part used in an image forming apparatus.
Figure 6:
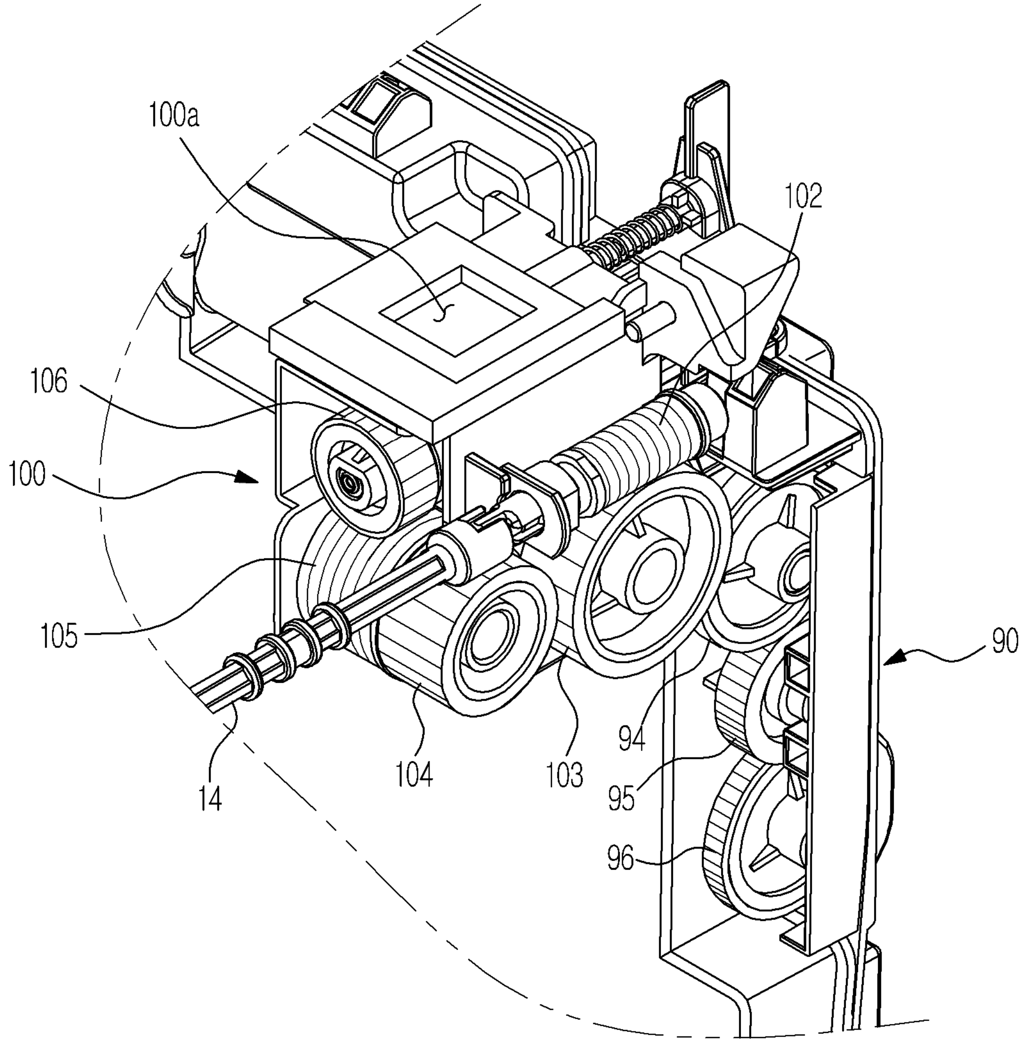
FIG. 6 is a perspective view illustrating an example of gears provided on the waste toner delivery part used in the image forming apparatus.

Referring to FIG. 4, the waste toner delivery part 100 includes an inlet 100*a*, an outlet 100*b*, and a delivery auger 101. The inlet 100*a* is provided at an upper side of the waste toner delivery part 100 to receive waste toner, which falls from the developing unit 30. The outlet 100*b* is provided at a lower side of the waste toner delivery part 100 to deliver the waste toner downward to the waste toner storage part 90. The delivery auger 101 delivers the waste toner from the inlet 100*a* to the outlet 100*b*. Referring to FIG. 6, gears 102, 103, 104, 105 and 106 are disposed at one side of the waste toner delivery part 100, thereby allowing the delivery auger 101 to rotate through the power transferred from an external source, such as the shaft 14 described in more detail below.

The waste toner delivery part 100 operates by receiving power from the fuser driving unit 80. To this end, a shaft 14 is disposed inside the body 10. The shaft 14 has a first end connected to the shaft driving gear 83 of the fuser driving unit 80 and a second end connected to a gear of the waste toner delivery part 100 such that the power generated from the fuser driving unit 80 is delivered to the waste toner delivery part 100.

The waste toner storage part 90 includes a waste toner storage case to accommodate the waste toner and also a flattening auger 93 rotatably installed inside the waste toner storage case to flatten the waste toner stored inside the waste storage toner case.

The waste toner storage case includes a first case 91 and a second case 92. The first case 91 has an open side to accommodate the flattening auger 93 such that the flattening auger 93 is installed inside the first case 91. The second case 92 is configured to cover the open side of the first case 91. The flattening auger 93 may include two flattening augers 93*a* and 93*b*, each laterally extending to move the waste toner in a horizontal direction. The two flattening augers 93*a* and 93*b* are disposed in parallel with each other. In addition, gears 94, 95 and 96 are disposed at one side of the waste toner storage case to evenly transfer power to the two flattening augers 93*a* and 93*b*.

The waste toner storage part 90 operates by receiving power from the waste toner delivery part 100. That is, the waste toner storage part 90 operates by receiving some of the power that has been conveyed through the waste toner delivery part 100. To this end, the gears 94, 95 and 96 provided at one side of the waste toner case are engaged with the gears 102, 103, 104, 105 and 106 provided on the waste toner delivery part 100, respectively, to deliver the power from the waste toner delivery part 100 to the waste toner storage part 90.

The irregular paper delivery unit 70 is provided on the shaft 14 (see FIG. 2). That is, since the driving pulley 71 of the irregular paper delivery unit 70 is provided on the shaft 14, the irregular paper delivery unit 70 operates according to the rotation of the shaft 14.

As described above, the fuser driving unit 80 is able to operate the fuser unit 50, the irregular paper delivery unit 70, the waste toner delivery part 100, and the waste toner storage part 90. Accordingly, each of the irregular paper delivery unit 70, the waste toner delivery part 100 and the waste toner storage part 90 is driven through the fuser driving unit 80 without having to install a respective driving unit for each of the irregular paper delivery unit 70, the waste toner delivery part 100, and the waste toner storage part 90.

Although the power generated from the fuser driving unit 80 is transferred to the irregular paper delivery unit 70, the waste toner transfer part 100, and the waste toner storage part 90, the present inventive concept is not limited thereto. According to another example embodiment, the power generated from the fuser driving unit 80 may be transferred to at least one of the irregular paper delivery unit 70, the waste toner delivery part 100, and the waste toner storage part 90.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. An image forming apparatus comprising:

a developing unit comprising a photoconductor and configured to develop an electrostatic latent image on the photoconductor to a visible image by use of toner;

a fuser unit configured to fuse the toner transferred on a printing medium;

a fuser driving unit configured to drive the fuser unit; and a waste toner storage unit configured to receive waste toner separated from the photoconductor and to store the waste toner, and to operate by receiving power from the fuser driving unit, the waste toner storage unit comprising:

a waste toner delivery part configured to transfer the waste toner from the photoconductor, and to operate by receiving power from the fuser driving unit; and a waste toner storage part configured to receive and store the waste toner transferred by the waste toner delivery part, and to operate by receiving power from the waste toner delivery part, the waste toner storage part comprising:

a waste toner storage case to accommodate the waste toner; and a flattening auger rotatably installed inside the waste toner storage case, wherein the flattening auger operates by receiving power from the waste toner delivery part.

2. The image forming apparatus of claim 1, wherein the waste toner delivery part comprises an inlet, to which the waste toner is received from the developing unit, an outlet to deliver the waste toner to the waste toner storage part, and a delivery auger to deliver the waste toner from the inlet to the outlet.

3. The image forming apparatus of claim 2, further comprising:

a shaft to convey the power from the fuser driving unit to the waste toner delivery part.

4. The image forming apparatus of claim 3, further comprising:

an irregular paper delivery unit disposed on a paper delivery path between the developing unit and the fuser unit, and the irregular paper delivery unit is further disposed on the shaft.

5. The image forming apparatus of claim 4, wherein the irregular paper delivery unit comprises a driving pulley disposed on the shaft, a driven pulley disposed while being spaced apart from the driving pulley, and a belt wound around the driving pulley and the driven pulley.

6. The image forming apparatus of claim 1, further comprising:

a main driving unit formed independent of the fuser driving unit to drive the developing unit.

7. An image forming apparatus comprising:

a developing unit comprising a photoconductor corresponding to an image receptor, the developing unit configured to develop an electrostatic latent image on the photoconductor to a visible image by use of toner;

a fuser unit configured to fuse toner transferred to a printing medium from the photoconductor;

a fuser driving unit configured to drive the fuser unit;

a waste toner storage part configured to store waste toner separated from the photoconductor;

a waste toner delivery part configured to deliver the waste toner from the developing unit to the waste toner storage part;

a shaft having a first end connected to the fuser driving unit and a second end connected to the waste toner delivery part; and an irregular paper delivery unit disposed on the shaft, wherein the waste toner storage part receives power from the waste toner delivery part.

8. The image forming apparatus of claim 7, wherein the waste toner delivery part comprises an inlet to which the waste toner is received from the developing unit, an outlet to deliver the waste toner to the waste toner storage part, and a delivery auger to deliver the waste toner from the inlet to the outlet.

9. The image forming apparatus of claim 7, wherein the waste toner storage part comprises a waste toner storage case to accommodate the waste toner and at least one flattening auger rotatably installed inside the waste toner storage case, wherein the at least one flattening auger operates by the power received from the waste toner delivery part.

10. The image forming apparatus of claim 7, wherein the irregular paper delivery unit comprises a driving pulley disposed on the shaft, a driven pulley separated from the driving pulley, and a belt wound around the driving pulley and the driven pulley.

11. An image forming apparatus comprising:

a developing unit comprising a photoconductor corresponding to an image receptor, the developing unit configured to develop an electrostatic latent image on the photoconductor to a visible image by use of toner;

a main driving unit configured to drive the developing unit;

a fuser unit configured to fuse toner transferred on a printing medium from the photoconductor;

a fuser driving unit formed independent of the main driving unit to drive the fuser unit;

a waste toner storage part to store waste toner separated from the photoconductor;

a waste toner delivery part to deliver the waste toner from the developing unit to the waste toner storage part; and an irregular paper delivery unit disposed on a paper delivery path between the developing unit and the fuser unit; and a shaft to convey power from the fuser driving unit to the waste toner delivery part, wherein:

the waste toner storage part operates by receiving power from the waste toner delivery part;

the irregular paper delivery unit is disposed on the shaft and operates by the shaft; and at least one of the waste toner storage part, the waste toner delivery part, and the irregular paper delivery unit operates by receiving power from the fuser driving unit.

12. The image forming apparatus of claim 11, wherein the irregular paper delivery unit comprises a driving pulley disposed on the shaft, a driven pulley separated from the driving pulley, and a belt wound around the driving pulley and the driven pulley.

13. The image forming apparatus of claim 11, wherein the waste toner delivery part comprises an inlet to which the waste toner is received from the developing unit, an outlet to deliver the waste toner to the waste toner storage part, and a delivery auger to deliver the waste toner from the inlet to the outlet.

14. The image forming apparatus of claim 13, wherein the waste toner storage part comprises a waste toner storage case to accommodate the waste toner and at least one flattening auger that is rotatably installed inside the waste toner storage case and operates by receiving power from the shaft and the waste toner delivery part.

15. An image forming apparatus, comprising:

a developing unit to develop a toner image on a photoconductive member;

a fixing unit to fix the developed toner image onto a recording medium, the fixing unit including fixing rollers and a fixing unit driving member; and a waste toner storage unit to store waste toner removed from the developing unit after developing a toner image, and to process the stored waste toner by receiving power from the fixing unit driving member, the waste toner storage unit comprising:

a waste toner delivery part configured to transfer the waste toner from the developing unit, and to operate by receiving power from the fixing unit driving member, and a waste toner storage part configured to receive and store the waste toner transferred by the waste toner delivery part, and to operate by receiving power from the waste toner delivery part, the waste toner storage part comprising:

a waste toner storage case to accommodate the waste toner; and a flattening auger rotatably installed inside the waste toner storage case, wherein the flattening auger operates by receiving power from the waste toner delivery part.

16. The image forming apparatus of claim 15, further comprising:

a shaft extending between the driving member of the fixing unit and the waste toner storage unit to receive and transfer power from the driving member of the fixing unit to drive the waste toner storage unit to process the stored waste toner.

17. The image forming apparatus of claim 15, further comprising:

a main driving unit to drive the developing unit.

18. An image forming apparatus, comprising:

a developing unit to develop a toner image on a photoconductive member;

a fixing unit to fix the developed toner image onto a recording medium, the fixing unit including fixing rollers and a fixing unit driving member;

a waste toner storage unit to store waste toner removed from the developing unit after developing a toner image, and to process the stored waste toner by receiving power from the fixing unit driving member;

a shaft extending between the driving member of the fixing unit and the waste toner storage unit to receive and transfer power from the driving member of the fixing unit to drive the waste toner storage unit to process the stored waste toner; and an irregular paper delivery unit disposed on the shaft along a paper delivery path and between the developing unit and the fixing unit such that the irregular paper delivery unit conveys irregular paper along the delivery path by power transferred from the driving member.

19. The image forming apparatus of claim 18, wherein the irregular paper delivery unit comprises:

a driving pulley disposed on the shaft to receive power from the shaft;

a driven pulley disposed a predetermined distance from the driving pulley and along the path; and a belt wound around the driving pulley and the driven pulley to rotate the driven pulley when the driving pulley is rotated, the irregular paper being conveyed along a portion of the belt.

20. An image forming apparatus comprising:

a developing unit comprising a photoconductor and configured to develop an electrostatic latent image on the photoconductor to a visible image by use of toner;

a fuser unit configured to fuse the toner transferred on a printing medium;

a fuser driving unit configured to drive the fuser unit;

a waste toner storage unit configured to receive waste toner separated from the photoconductor and to store the waste toner, and to operate by receiving power from the fuser driving unit;

a shaft to convey the power from the fuser driving unit to the waste toner delivery part; and an irregular paper delivery unit disposed on a paper delivery path between the developing unit and the fuser unit, and the irregular paper delivery unit is further disposed on the shaft.

* * * * *

UNITED STATES PATENT AND TRADEMARK OFFICE

CERTIFICATE OF CORRECTION

PATENT NO. : 8,849,174 B2
APPLICATION NO. : 13/338613
DATED : September 30, 2014
INVENTOR(S) : Yoo Hung Jeong et al.

It is certified that error appears in the above-identified patent and that said Letters Patent is hereby corrected as shown below:

In the Claims

Column 8, line 22, In Claim 11, after “part;” delete “and”.

Signed and Sealed this
Nineteenth Day of May, 2015

Michelle K. Lee

*Director of the United States Patent and Trademark Office*